United States Patent
Ogden (10) Patent No.: US 11,438,653 B2
(45) Date of Patent: Sep. 6, 2022

(54) METHOD AND SYSTEM FOR DETECTING INCOMPATIBLE CABLE (HDMI)

(71) Applicant: ARRIS Enterprises LLC, Suwanee, GA (US)

(72) Inventor: John D. Ogden, Media, PA (US)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 17/320,264

(22) Filed: May 14, 2021

(65) Prior Publication Data
US 2022/0030303 A1    Jan. 27, 2022

Related U.S. Application Data

(60) Provisional application No. 63/055,752, filed on Jul. 23, 2020.

(51) Int. Cl.
| | |
|---|---|
| H04N 21/4425 | (2011.01) |
| H04N 17/00 | (2006.01) |
| G01R 31/58 | (2020.01) |
| H04N 21/4363 | (2011.01) |

(52) U.S. Cl.
CPC ......... *H04N 21/4425* (2013.01); *G01R 31/58* (2020.01); *H04N 17/004* (2013.01); *H04N 21/43635* (2013.01)

(58) Field of Classification Search
CPC ............. H04N 21/4425; H04N 17/004; H04N 21/43635; G01R 31/58
See application file for complete search history.

(56) References Cited

U.S. PATENT DOCUMENTS

| | | | |
|---|---|---|---|
| 9,329,672 B2 | 5/2016 | Du | |
| 2006/0031895 A1 | 2/2006 | Kwon et al. | |
| 2011/0283129 A1 | 11/2011 | Guillerm | |
| 2012/0166702 A1* | 6/2012 | Toba | G06F 13/20 |
| | | | 710/316 |

(Continued)

FOREIGN PATENT DOCUMENTS

| | | |
|---|---|---|
| KR | 10-1092438 B1 | 12/2011 |
| KR | 10-1485790 B1 | 1/2015 |

OTHER PUBLICATIONS

"HDMI 2.1: How it Became the Most Popular Display Interface" Posted by VIP Experts (https://blogs.synopsys.com/vip-central/author/vipexpert/) on Mar. 20, 2018 (Year: 2018).*

(Continued)

*Primary Examiner* — Yassin Alata
(74) *Attorney, Agent, or Firm* — Panitch Schwarze Belisario & Nadel (57) ABSTRACT

A method, a set-top box, and non-transitory computer readable medium are disclosed for detecting incompatible cables for devices. The method includes: setting, on an electronic device, a high speed data-transfer mode; sending, from the electronic device, data to a device at the high speed data-transfer mode over a cable under test; determining, on the electronic device, a number of authentication attempts by the device; and determining, by the electronic device, that the number of authentication attempts by the device is less a predetermined number that the cable under test is compatible with the high speed data-transfer mode.

20 Claims, 5 Drawing Sheets

(56) References Cited

U.S. PATENT DOCUMENTS

2012/0327250 A1   12/2012  Zhang et al.
2014/0211941 A1*  7/2014  Oh ................... H04N 21/43622
                                                                380/201
2018/0061365 A1*  3/2018  Lee ....................... G09G 3/2092

OTHER PUBLICATIONS

Notification of Transmittal of the International Search Report (Forms PCT/ISA/220 and PCT/ISA/210) and the Written Opinion of the International Searching Authority (Form PCT/ISA/237) dated Aug. 26, 2021, by the International Application Division Korean Intellectual Property Office in corresponding International Application No. PCT/US2021/032363. (8 pages).

* cited by examiner

METHOD AND SYSTEM FOR DETECTING INCOMPATIBLE CABLE (HDMI)

FIELD

The present disclosure relates to a method and system for detecting incompatible cables, and more specifically a method and system for detecting incompatible HDMI cables.

BACKGROUND

Cable service providers, which are also referred to as Multiple System Operators ("MSO"), or any communication or content distribution business that operates through a cable network, renders its services to its subscribers. The services can include, but are not limited to, different subscription plans for broadband Internet access, live television, movies, visual media, and telephony. In order to consume these services, subscribers connect to a private network owned (or co-owned or rented) by the broadband cable operator which is implemented according to the Data Over Cable Service Interface Specification (DOCSIS) standard.

To provide television and data services, a MSO typically uses a Cable Modem Termination System ("CMTS") for the data services and a quadrature amplitude modulation ("QAM") multiplexer for downstream broadcast television, narrow cast and video-on-demand (VoD) traffic signals. These devices may be located at one or more hubs, which are typically connected to a head end via a network according to a networking protocol, such as Ethernet or SONET. A residential cable customer is typically connected to the CMTS and hub via a cable modem and a wireless router that may be combined in a single box which is called a gateway. In order to view video content that is transmitted through the cable modem or gateway, residential customers connect their televisions to a set-top box (STB). Since set-top boxes have recently gained additional features and functionality, they are often referred to as a smart media device ("SMD") and can be considered as the network interface controller for their peripheral devices.

The set-top box can be used by the subscriber to access a variety of multimedia services, including but not limited to live or linear television, digital video recorder (DVR) content, video-on-demand (VoD) content, over-the-top (OTT) content, and others. For example, set-top boxes usually play user selected content, for example, either live or with a digital video recorder (DVR).

HDMI is a proprietary audio/video interface for transmitting uncompressed video data and compressed or uncompressed digital audio data from an HDMI-compliant source device, for example, a set-top box to a television. HDMI implements the EIA/CEA-861 standards, which define video formats and waveforms, transport of compressed and uncompressed LPCM audio, auxiliary data, and implementations of the VESA EDID. HDMI cables continue to increase in the bandwidth or capabilities of what can be transmitted over the cable. HDMI 2.1 is the latest version and supports higher resolution video output and higher refresh rates, including, for example, 4K 120 Hz and 8K 120 Hz, and requires a cable with enhanced capability. However, the new cable is backwards compatible with existing cables so that existing cables may be used, but the existing cables may cause failures when used with new HDMI 2.1 capable devices and modes, which can result in consumer confusion because the source of the failure may not be immediately apparent since HDMI cables are not clearly identified by capabilities and/or type of cable.

It would be desirable for a method and system for detecting or identifying a possible incompatible cable, for example, when the consumer is connecting two HDMI 2.1 compatible devices.

SUMMARY

The present disclosure provides a method and system for detecting incompatible cables, for example, for detecting an incompatible HDMI cable, for example, when connecting HDMI 2.1 compatible devices.

In accordance with an aspect, a method is disclosed for detecting incompatible cables for devices, the method comprising: setting, on an electronic device, a high speed data-transfer mode; sending, from the electronic device, data to a device at the high speed data-transfer mode over a cable under test; determining, on the electronic device, a number of authentication attempts by the device; and determining, by the electronic device, that the number of authentication attempts by the device is less a predetermined number that the cable under test is compatible with the high speed data-transfer mode.

In accordance with another aspect, a set-top box is disclosed configured to detect incompatible cables, the set-top box comprising: a processor configured to: set a high speed data-transfer mode; send data to a device at the high speed data-transfer mode over a cable under test; determine a number of authentication attempts by the device; and determine that the number of authentication attempts by the device is less a predetermined number that the cable under test is compatible with the high speed data-transfer mode.

In accordance with a further aspect, a non-transitory computer readable medium having instructions operable to cause one or more processors to perform operations comprising: setting, on an electronic device, a high speed data-transfer mode; sending, from the electronic device, data to a device at the high speed data-transfer mode over a cable under test; determining, on the electronic device, a number of authentication attempts by the device; and determining, by the electronic device, that the number of authentication attempts by the device is less a predetermined number that the cable under test is compatible with the high speed data-transfer mode.

BRIEF DESCRIPTION OF THE DRAWING FIGURES

The scope of the present disclosure is best understood from the following detailed description of exemplary embodiments when read in conjunction with the accompanying drawings. Included in the drawings are the following figures.

Further areas of applicability of the present disclosure will become apparent from the detailed description provided hereinafter. It should be understood that the detailed description of exemplary embodiments are intended for illustration purposes only and are, therefore, not intended to necessarily limit the scope of the disclosure.

DETAILED DESCRIPTION

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In some instances, well known methods and structures have not been described in detail so as not to unnecessarily obscure the embodiments.

System for Detecting Incompatible Cable

Figure 1:
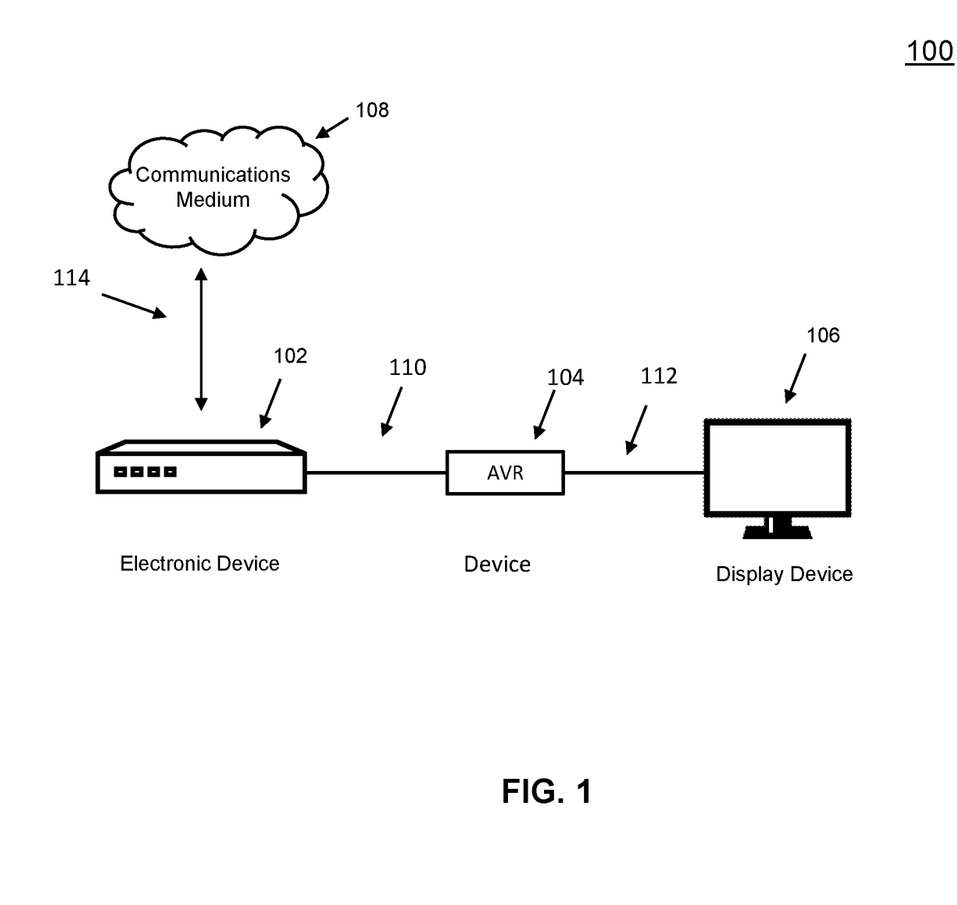
FIG. 1 is a consumer set-top entertainment system for detecting an incompatible cable, for example, an incompatible HDMI cable in accordance with exemplary embodiments.

FIG. 1 illustrates a consumer set-top entertainment system 100 for a detecting an incompatible cable, for example, an incompatible HDMI cable in accordance with exemplary embodiments. The system 100 may include an electronic device 102, an optional HDMI compatible device 104, and a display device 106, for example, a television. The electronic device 102, discussed in more detail below, may be a computing device configured to receive source signals that are superimposed or otherwise encoded with a video. For instance, the electronic device 102 may be a set-top box interfaced with the optional HDMI compatible device 104, for example, an audio/video recorder (AVR) and/or the display device 106 with one or more HDMI cables 110, 112.

The electronic device 102 may receive a source signal that is electronically transmitted via a communications medium 108, such as over-the-air, over a cable connection 114 (e.g., via HDMI cable, component cables, NV (composite) cable, coaxial cable, fiber optic, or other suitable physical cable), via satellite, or other suitable communications medium. For example, the communications medium 108 may be broadcast television, a local area network, cellular communication network, or the Internet where the source signal may be streamed to the electronic device 102 using the communications medium 108. In some instances, the source signal may be received from media inserted into one or more suitable input devices of the electronic device 102. For example, the source signal may be read from a digital video disc (DVD) or a Blu-ray disc.

Computer System Architecture

Figure 2:
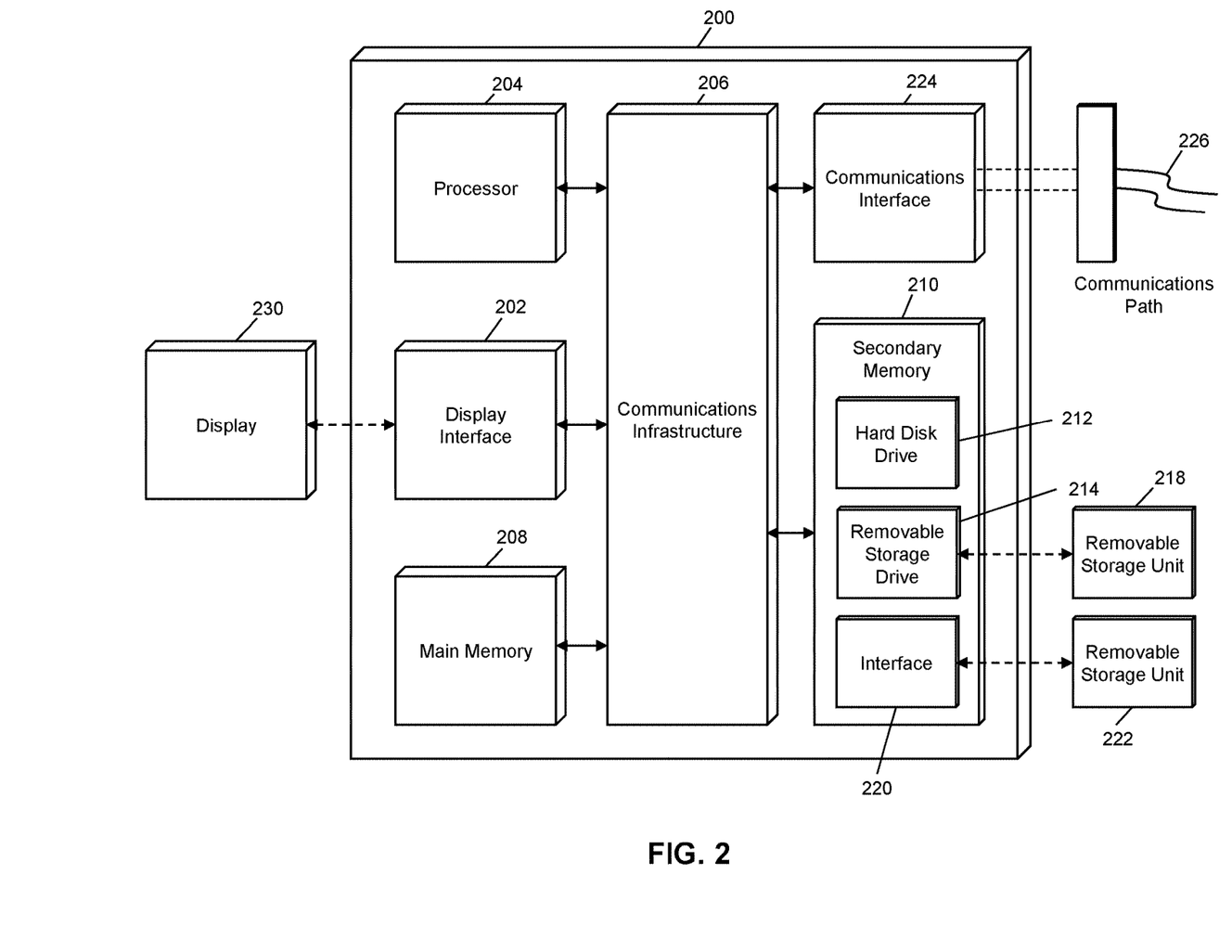
FIG. 2 is an exemplary hardware structure for an embodiment of a communication device for detecting an incompatible cable in accordance with exemplary embodiments.

FIG. 2 illustrates a representative computer system 200 in which embodiments of the present disclosure, or portions thereof, may be implemented as computer-readable code executed on hardware. For example, the electronic device 102, for example, a set-top box, and the one or more devices 104, 106 of FIG. 1 may be implemented in whole or in part by a computer system 200 using hardware, software executed on hardware, firmware, non-transitory computer readable media having instructions stored thereon, or a combination thereof and may be implemented in one or more computer systems or other processing systems. Hardware, software executed on hardware, or any combination thereof may embody modules and components used to implement the methods and steps of the presently described method and system.

If programmable logic is used, such logic may execute on a commercially available processing platform configured by executable software code to become a specific purpose computer or a special purpose device (for example, programmable logic array, application-specific integrated circuit, etc.). A person having ordinary skill in the art may appreciate that embodiments of the disclosed subject matter can be practiced with various computer system configurations, including multi-core multiprocessor systems, minicomputers, mainframe computers, computers linked or clustered with distributed functions, as well as pervasive or miniature computers that may be embedded into virtually any device. For instance, at least one processor device and a memory may be used to implement the above described embodiments.

A processor unit or device as discussed herein may be a single processor, a plurality of processors, or combinations thereof. Processor devices may have one or more processor "cores." The terms "computer program medium," "non-transitory computer readable medium," and "computer usable medium" as discussed herein are used to generally refer to tangible media such as a removable storage unit 218, a removable storage unit 222, and a hard disk installed in hard disk drive 212.

Various embodiments of the present disclosure are described in terms of this representative computer system 200. After reading this description, it will become apparent to a person skilled in the relevant art how to implement the present disclosure using other computer systems and/or computer architectures. Although operations may be described as a sequential process, some of the operations may in fact be performed in parallel, concurrently, and/or in a distributed environment, and with program code stored locally or remotely for access by single or multi-processor machines. In addition, in some embodiments the order of operations may be rearranged without departing from the spirit of the disclosed subject matter.

A processor device 204 may be processor device specifically configured to perform the functions discussed herein. The processor device 204 may be connected to a communications infrastructure 206, such as a bus, message queue, network, multi-core message-passing scheme, etc. The network may be any network suitable for performing the functions as disclosed herein and may include a local area network ("LAN"), a wide area network ("WAN"), a wireless network (e.g., "Wi-Fi"), a mobile communication network, a satellite network, the Internet, fiber optic, coaxial cable, infrared, radio frequency ("RF"), or any combination thereof. Other suitable network types and configurations will be apparent to persons having skill in the relevant art. The computer system 200 may also include a main memory 208 (e.g., random access memory, read-only memory, etc.), and may also include a secondary memory 210. The secondary memory 210 may include the hard disk drive 212 and a removable storage drive 214, such as a floppy disk drive, a magnetic tape drive, an optical disk drive, a flash memory, etc.

The removable storage drive 214 may read from and/or write to the removable storage unit 218 in a well-known manner. The removable storage unit 218 may include a removable storage media that may be read by and written to by the removable storage drive 214. For example, if the removable storage drive 214 is a floppy disk drive or universal serial bus port, the removable storage unit 218 may be a floppy disk or portable flash drive, respectively. In one embodiment, the removable storage unit 218 may be non-transitory computer readable recording media.

In some embodiments, the secondary memory 210 may include alternative means for allowing computer programs or other instructions to be loaded into the computer system 200, for example, the removable storage unit 222 and an interface 220. Examples of such means may include a program cartridge and cartridge interface (e.g., as found in video game systems), a removable memory chip (e.g., EEPROM, PROM, etc.) and associated socket, and other removable storage units 222 and interfaces 220 as will be apparent to persons having skill in the relevant art.

Data stored in the computer system 200 (e.g., in the main memory 208 and/or the secondary memory 210) may be stored on any type of suitable computer readable media, such as optical storage (e.g., a compact disc, digital versatile disc, Blu-ray disc, etc.) or magnetic storage (e.g., a hard disk drive). The data may be configured in any type of suitable database configuration, such as a relational database, a structured query language (SQL) database, a distributed database, an object database, etc. Suitable configurations and storage types will be apparent to persons having skill in the relevant art.

The computer system 200 may also include a communications interface 224. The communications interface 224 may be configured to allow software and data to be transferred between the computer system 200 and external devices. Exemplary communications interfaces 224 may include a modem, a network interface (e.g., an Ethernet card), a communications port, a PCMCIA slot and card, etc. Software and data-transferred via the communications interface 224 may be in the form of signals, which may be electronic, electromagnetic, optical, or other signals as will be apparent to persons having skill in the relevant art. The signals may travel via a communications path 226, which may be configured to carry the signals and may be implemented using wire, cable, fiber optics, a phone line, a cellular phone link, a radio frequency link, etc.

The computer system 200 may further include a display interface 202. The display interface 202 may be configured to allow data to be transferred between the computer system 200 and external display 230. Exemplary display interfaces 202 may include high-definition multimedia interface (HDMI), digital visual interface (DVI), video graphics array (VGA), etc. The display 230 may be any suitable type of display for displaying data transmitted via the display interface 202 of the computer system 200, including a cathode ray tube (CRT) display, liquid crystal display (LCD), light-emitting diode (LED) display, capacitive touch display, thin-film transistor (TFT) display, etc.

Computer program medium and computer usable medium may refer to memories, such as the main memory 208 and secondary memory 210, which may be memory semiconductors (e.g., DRAMs, etc.). These computer program products may be means for providing software to the computer system 200. Computer programs (e.g., computer control logic) may be stored in the main memory 208 and/or the secondary memory 210. Computer programs may also be received via the communications interface 224. Such computer programs, when executed, may enable computer system 200 to implement the present methods as discussed herein. In particular, the computer programs, when executed, may enable processor device 204 to implement the methods illustrated by FIGS. 1, 3 and 4, as discussed herein. Accordingly, such computer programs may represent controllers of the computer system 200. Where the present disclosure is implemented using software executed on hardware, the software may be stored in a computer program product and loaded into the computer system 200 using the removable storage drive 214, interface 220, and hard disk drive 212, or communications interface 224.

The processor device 204 may comprise one or more modules or engines configured to perform the functions of the computer system 200. Each of the modules or engines may be implemented using hardware and, in some instances, may also utilize software executed on hardware, such as corresponding to program code and/or programs stored in the main memory 208 or secondary memory 210. In such instances, program code may be compiled by the processor device 204 (e.g., by a compiling module or engine) prior to execution by the hardware of the computer system 200. For example, the program code may be source code written in a programming language that is translated into a lower level language, such as assembly language or machine code, for execution by the processor device 204 and/or any additional hardware components of the computer system 200. The process of compiling may include the use of lexical analysis, preprocessing, parsing, semantic analysis, syntax-directed translation, code generation, code optimization, and any other techniques that may be suitable for translation of program code into a lower level language suitable for controlling the computer system 200 to perform the functions disclosed herein. It will be apparent to persons having skill in the relevant art that such processes result in the computer system 200 being a specially configured computer system 200 uniquely programmed to perform the functions discussed above.

Exemplary Method for Detecting Incompatible Cable (HDMI)

In accordance with an exemplary embodiment, a method and system is disclosed for detecting an incompatible cable, for example, an HDMI cable 112, 114, by identifying failure modes that likely will occur only with non-compliant cables and implementing tests in the set-top box that can isolate the failure as a non-compliant cable failure with a high degree of certainty. The main difference between HDMI Version 1.4 cables and Version 2.x (e.g., Version 2.0 and Version 2.1) cables is their ability to support higher data rates. For example, the HDMI 1.4 cable transition-minimized differential signaling (TMDS) lines can support data rates up to 340 MHz (Mcsc), however, HMDI 2.x requires cables that can support, for example, 600 MHz (Mcsc).

In accordance with an exemplary embodiment, High-bandwidth Digital Content Protection (HDCP) 2.2 specifies a link integrity check that uses data island packets in the TMDS lines. The receiver checks the Error Correction Code (ECC) parity of these data island packets and initiates re-authentication, if too many errors are detected. In accordance with an embodiment, a failure mode can be used to detect a change in the frequency of HDCP link integrity failures when the mode is using the 340 MHz (Mcsc) data rate compared, for example, to the failure rate at 600 MHz (Mcsc).

In accordance with an embodiment, for example, by detecting an HDCP failure from a deployment a HDMI 2.x capable set-top boxes and a resulting HDCP 2.2 failure can be used to determine that incompatible HDMI cables 110, 112 are being used.

In accordance with an embodiment, an HDMI 2.x capable set-top box may be connected to an HDMI 2.x capable TV set, and the set-top box reads the Extended Display Identification Data (EDID) from the TV set and determines that high data rate modes (600 Mscs) are supported. The set-top box completes HDCP 2.2 authentication with the TV set and performs the following test: the set-top box sets the video output resolution, for example, to 340 MHz (Mscs) format such as 720p and verifies that the link integrity check is performed without error for several seconds. Then, the set-top box switches to a high bandwidth format, such as 4K 30 Hz and again checks the link integrity check is performed without error. If the number of re-authentication requests from the display device, for example, the television exceeds a pre-determined threshold during the high bandwidth formal test period, the set-top box will present the end-user with a message explaining that the HDMI cable is not compatible with the HDMI 2.x and should be replaced with a High Speed or Ultra High Speed cable for best performance.

In accordance with an exemplary embodiment, a standard HDMI cable, can support, for example, 1080i and 720p video formats, and a high speed HDMI cable can support, for example, 1080p, 4K 30 Hz, 3D and deep color video formats. The primary difference in the cable is the maximum TMDS Character Rate 340 MHz for the 1.4 standard and 600 MHz for the 2.x standard. If you attempt to use, for example, a cable designed for the 1.4 standard with a new equipment and exercise the any of the new modes that require the higher bandwidth TMDS signals, it's likely the old cable will not fully support the bandwidth resulting in either complete failure to pass the signal, or more likely, intermittent failures and errors.

In accordance with an exemplary embodiment, a high-speed HDMI cable supports the higher 600 MHz TMDS bus speed by improvements to the cable construction. For example, the TMDS lines are balanced and shielded lines that are designed to support a particular bandwidth. Alternatively, cables built at the lower costs to support 340 MHz TMDS signal pass a degraded signal at higher bandwidths. New, for example, high speed cables incorporate specific dimensions and materials that can support the higher 600 MHz signal, for example, for their respective length. In accordance with an embodiment, the result of attempting to use a standard cable to support a high speed mode will be data errors that will manifest as glitches, tearing, or loss of signal and may be intermittent depending on the level of signal degradation.

In accordance with an embodiment, it would be desirable to use identifiable failures that would typically result from a particular signal degradation to identify unsupported cables, and which can isolate failures due to other causes from the specific failures that would result from using a standard cable when setting HDMI 2.0 modes.

Figure 3A:
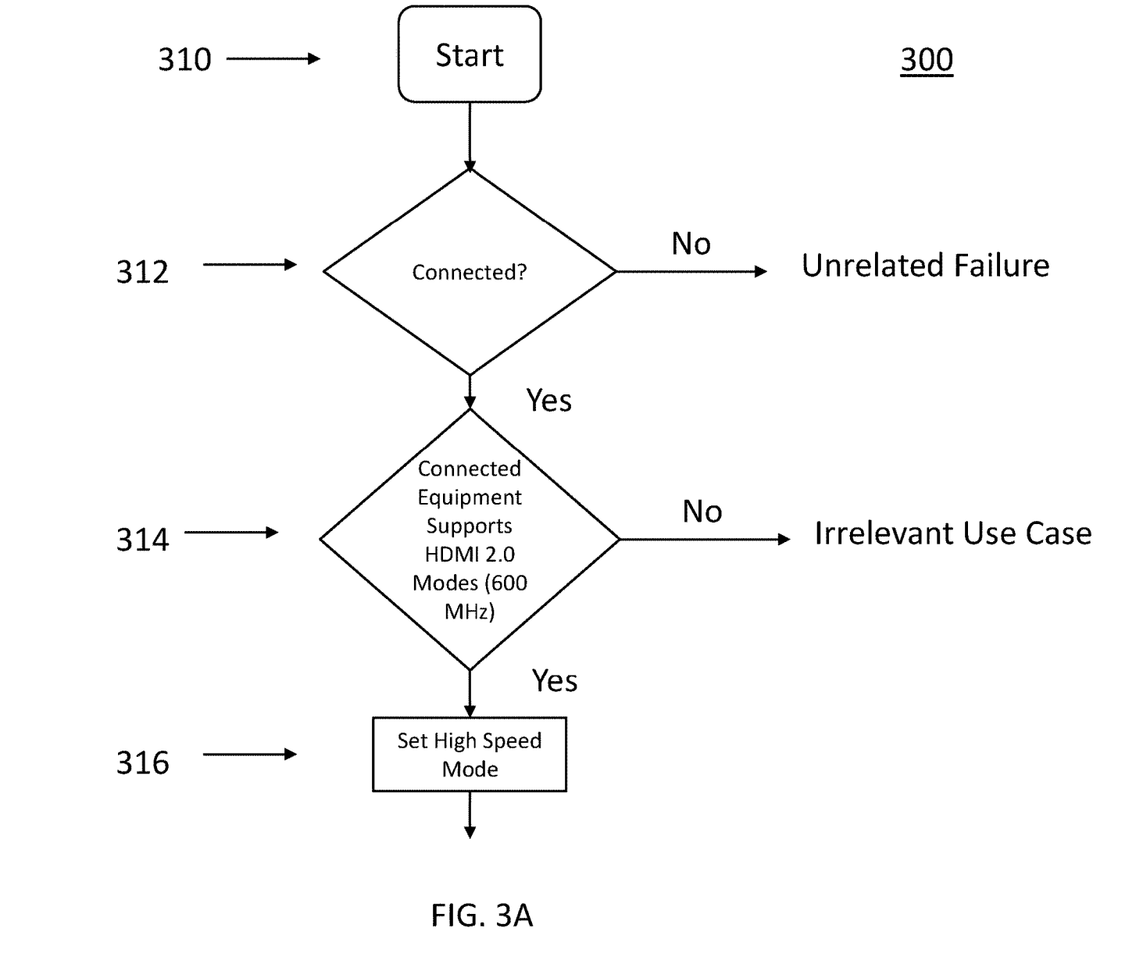
FIGS. 3A and 3B is a flow chart illustrating an exemplary method for detecting an incompatible cable in accordance with exemplary embodiment.
Figure 3B:
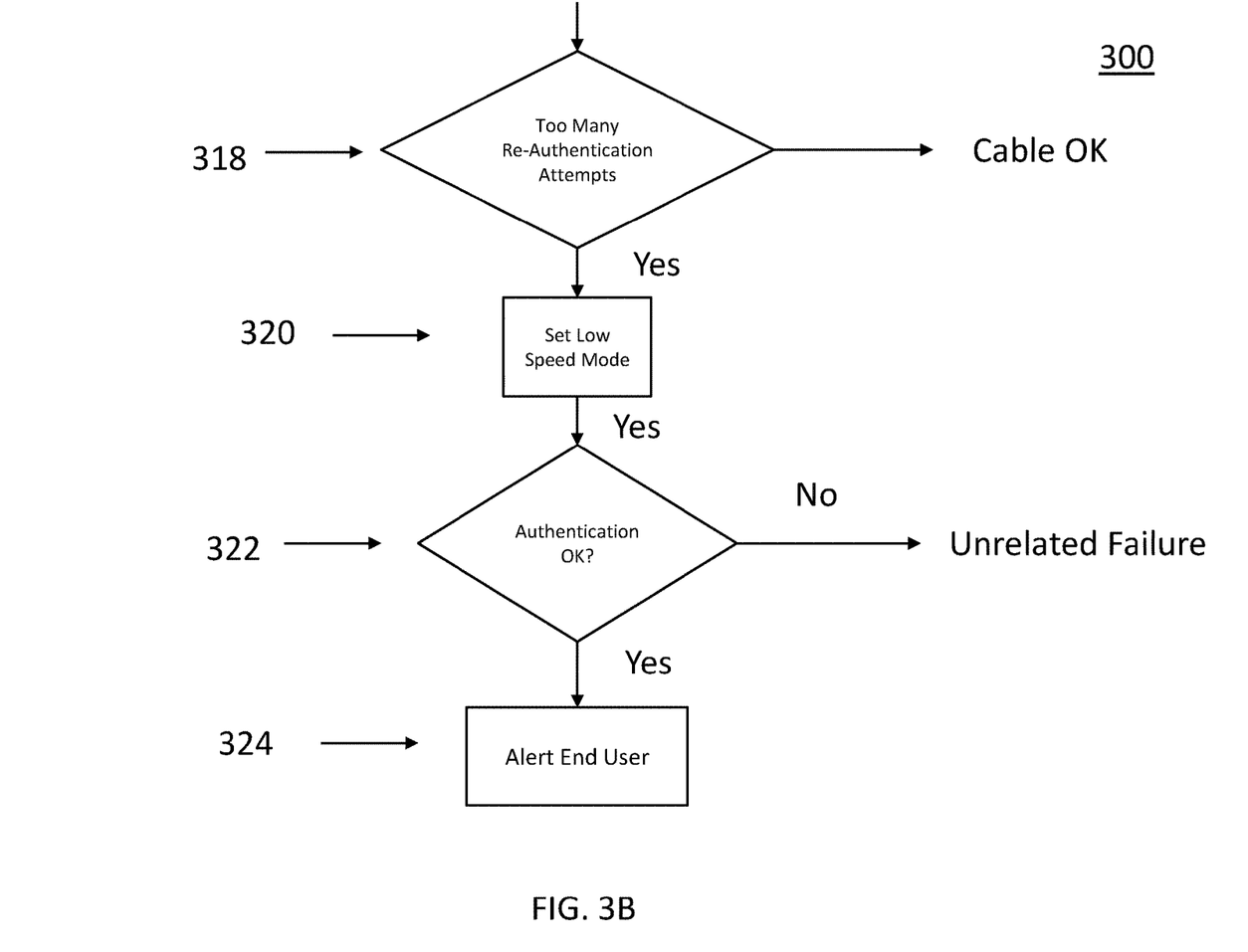

FIGS. 3A and 3B is a flow chart 300 illustrating an exemplary method for detecting an incompatible cable in accordance with exemplary embodiment. As shown in FIG. 3, the process starts in step 310. In step 312, a determination is made if the cable under test 110, 112 is connected to the electronic device 102 and/or the display device 106, and/or optionally, the device 104. If the cable under test 110, 112 is not connected to the electronic device 102, the display device 106, and/or optionally, the device 104, an unrelated failure is detected, for example, failure to connect the cable under test 110, 112 to connect to the electronic device 102, the display device, and/or optionally, the device 104. If the cable(s) under test 110, 112 are connected to the electronic device 102, the display device 106, and/or optionally, the device 104, the process continues to step 314. In step 314, a determination is made if the connected equipment, for example, the electronic device 102, the display device 106, and/or optionally, the device 104, supports HDMI 2.0 or higher modes (e.g., a video output resolution requiring a 600 MHz bus speed or greater). If the equipment, the electronic device 102, the display device 106, and/or optionally, the device 104 do not support HDMI 2.0, the use of a new HDMI cable is not relevant since one or more of the electronic device 102, the display device 106, and/or optionally, the device 104, is not configured to support HDMI 2.0 and it can be noted to be an "irrelevant use case". If the equipment, the electronic device 102, the display device 106, and/or optionally, the device 104, support HMDI 2.0 or higher, the process continues to step 316. In step 316, the electronic device 102, for example, the set-top box is set to a high speed mode, for example, 600 MHz.

In accordance with an exemplary embodiment, in step 318, the number of re-authentication attempts is noted. If the number of re-authentication attempts exceeds a predetermined number, for example, 2 or more re-authentication attempts, the process continues to step 320. If the number of re-authentication attempts is less than the predetermined number, for example, one or less, a determination is made that the cable(s) under test 110, 112 between the electronic device 102, the display device 106, and/or optionally, the device 104 are compatible.

In step 320, the electronic device 102, for example, the set-top box, is set to a low speed mode, for example, 340 MHz. In step 322, a determination is made if the electronic device 102, the display device 106, and/or optionally, the device 104 can be authenticated. If the electronic device 102, the display device 106, and/or optionally, the device 104, cannot authenticate, a determination can be made that the failure is unrelated to the cables under test 110, 112. If the electronic device 102, the display device 106, and/or optionally, the device 104, can authenticate, then in step 324, the user can be alerted that one or more of the cables under test 110, 112 are not compatible with the capabilities of the equipment 102, 104, 106, for example, with the HDMI 2.0 compatible devices. For example, the user can be advised that the cable under test 110, 112 supports the low speed data-transfer mode, but not the high speed transfer mode. In addition, the user can be advised that the cable under test 110, 112 is likely a standard rather than a high-speed cable (e.g., HMDI 2.x cable).

Figure 4:
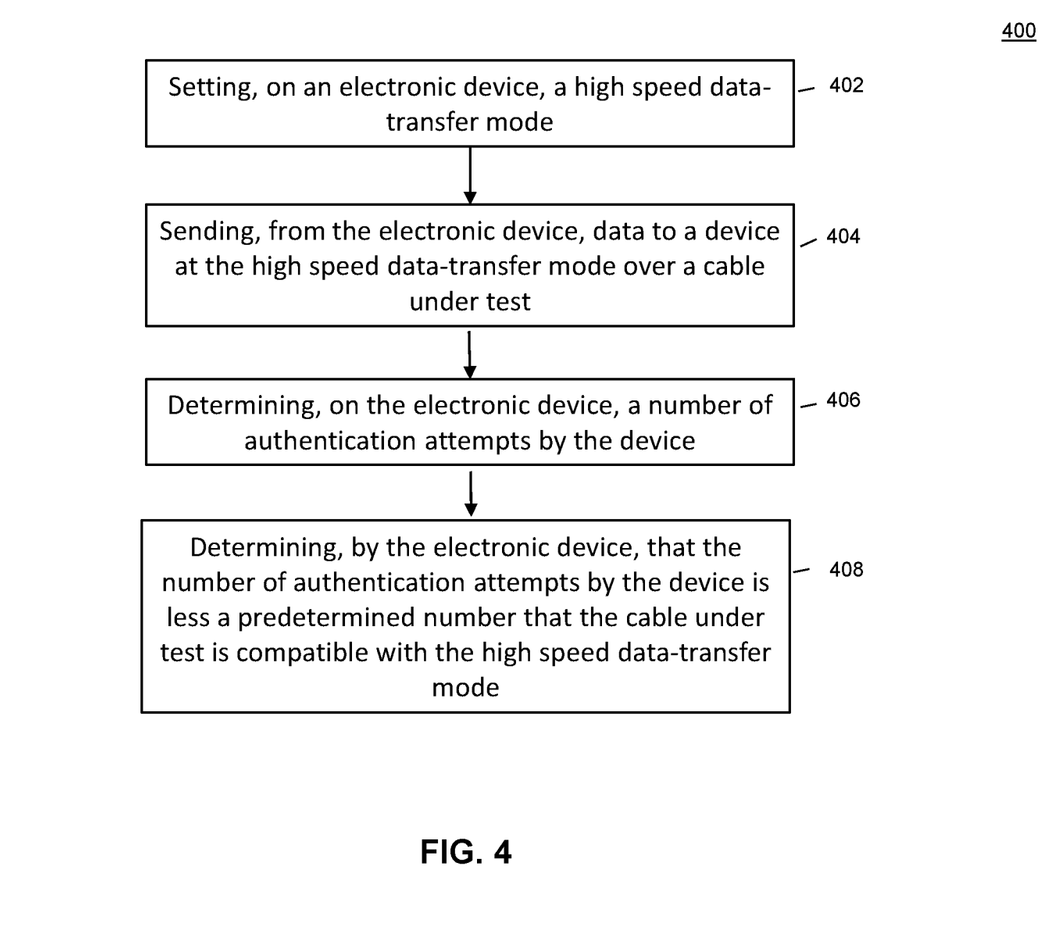
FIG. 4 is another flow chart illustrating an exemplary method for detecting an incompatible cable in accordance with exemplary embodiment.

FIG. 4 is another flow chart 400 illustrating an exemplary method for detecting an incompatible cable in accordance with exemplary embodiment. As shown in FIG. 4, in step 402, setting a high speed data-transfer mode on an electronic device. In step 404, sending data from the electronic device to a device at the high speed data-transfer mode over a cable under test. In step 406, determining, on the electronic device, a number of authentication attempts by the device. In step 408, determining by the electronic device, that the number of authentication attempts by the device is less a predetermined number that the cable under test is compatible with the high speed data-transfer mode.

In accordance with an embodiment, when the number of attempts to authenticate the device is equal to or greater than the predetermined number, the method further includes: setting, on the electronic device, a low speed data-transfer mode; sending, from the electronic device, data to the device at the low speed data-transfer mode; and determining, on the electronic device, if the authentication with the device has been established that the cable under test is not compatible with the high speed data-transfer mode. In accordance with an embodiment, the method can include reading, by the electronic device, an Extended Display Identification Data (EDID) from the device to determine if the device can support the high speed data-transfer mode.

In accordance with an embodiment, the cable under test may be a High-Definition Multimedia Interface (HDMI) cable, the high speed data-transfer mode is a video output resolution having an output resolution of 600 MHz or greater, and the low speed data-transfer mode is a video output resolution of 340 MHz.

In accordance with an embodiment, the electronic device may be a HDMI 2.x capable set-top box, the device is a display device, and the cable under test is an HDMI cable. The method can further include: reading, by the set-top box, an Extended Display Identification Data (EDID) from the display device to determine if the display device is HDMI 2.x capable; and when the display device are not HDMI 2.x capable, determining that a determination on the cable under test being compatible with the high speed data-transfer mode cannot be made. In accordance with an exemplary embodiment, the authentication attempts are High-bandwidth Digital Content Protection (HDCP 2.2) authentication, and the method further includes hosting, on the electronic device, firmware configured to execute the HDCP 2.2 authentication with the device.

Techniques consistent with the present disclosure provide, among other features, a method and system for detecting incompatible cable, for example, for detecting an incompatible HDMI cable. While various exemplary embodiments of the disclosed method and system have been described above it should be understood that they have been presented for purposes of example only, not limitations. It is not exhaustive and does not limit the disclosure to the precise form disclosed. Modifications and variations are possible in light of the above teachings or may be acquired from practicing of the disclosure, without departing from the breadth or scope.

What is claimed is:

1. A method for detecting incompatible cables for devices, the method comprising:
   sending, from an electronic device, data to a device at a high speed data-transfer mode over a cable under test, the electronic device and the device configured to support the high speed data-transfer mode;
   determining, on the electronic device, a number of authentication attempts by the device over the cable under test; and
   determining, by the electronic device, that when the number of authentication attempts by the device over the cable under test is less than a predetermined number that the cable under test is compatible with the high speed data-transfer mode of the electronic device and the device.

2. The method according to claim 1, wherein when the number of attempts to authenticate the device is equal to or greater than the predetermined number, the method further comprising:
   sending, from the electronic device, data to the device at a low speed data-transfer mode of the electronic device; and
   determining, on the electronic device, that when the authentication with the device over the cable under test has been established that the cable under test is not compatible with the high speed data-transfer mode of the electronic device and the device.

3. The method according to claim 1, further comprising:
   reading, by the electronic device, an Extended Display Identification Data (EDID) from the device to determine that the device can support the high speed data-transfer mode of the electronic device.

4. The method according to claim 1, wherein the cable under test is a High-Definition Multimedia Interface (HDMI) cable, and wherein the high speed data-transfer mode of the electronic device is a video output resolution having an output resolution of 600 MHz or greater.

5. The method according to claim 2, wherein the cable under test is an HDMI cable, the high speed data-transfer mode of the electronic device is a video output resolution requiring a 600 MHz TMDS bus speed or greater, and the low speed data-transfer mode of the electronic device is a video output resolution requiring a 340 MHz TMDS bus speed.

6. The method according to claim 1, wherein the electronic device is a HDMI 2.x capable set-top box, the device is a display device, and the cable under test is an HDMI cable, the method further comprising:
   reading, by the set-top box, an Extended Display Identification Data (EDID) from the display device to determine that the display device is HDMI 2.x capable; and
   when the display device is not HDMI 2.x capable, determining that a determination on the cable under test being compatible with the high speed data-transfer mode of the electronic device cannot be made.

7. The method according to claim 1, wherein the authentication attempts are High-bandwidth Digital Content Protection (HDCP 2.2) authentication, the method further comprising:
   hosting, on the electronic device, firmware configured to execute the HDCP 2.2 authentication with the device.

8. A set-top box configured to detect incompatible cables, the set-top box comprising:
   a processor configured to:
      send data to a device at a high speed data-transfer mode over a cable under test, the set-top box and the device configured to support the high speed data-transfer mode;
      determine a number of authentication attempts by the device over the cable under test; and
      determine that when the number of authentication attempts by the device over the cable under test is less than a predetermined number that the cable under test is compatible with the high speed data-transfer mode of the set-top box and the device.

9. The set-top box according to claim 8, wherein when the number of attempts to authenticate the device is equal to or greater than the predetermined number, the processor further configured to:
   send data to the device at a low speed data-transfer mode; and
   determine that when the authentication with the device over the cable under test has been established that the cable under test is not compatible with the high speed data-transfer mode of the set-top box and the device.

10. The set-top box according to claim 8, wherein the processor is further configured to:
    read an Extended Display Identification Data (EDID) from the device to determine that the device can support the high speed data-transfer mode of the set-top box.

11. The set-top box according to claim 8, wherein the cable under test is a High-Definition Multimedia Interface (HDMI) cable, and wherein the high speed data-transfer mode of the set-top box is a video output resolution requiring a 600 MHz TMDS bus speed or greater.

12. The set-top box according to claim 9, wherein the cable under test is an HDMI cable, the high speed data-transfer mode of the set-top box is a video output resolution requiring a 600 MHz TMDS bus speed or greater, and the low speed data-transfer mode of the set-top box is a video output resolution requiring a 340 MHz TMDS bus speed.

13. The set-top box according to claim 8, wherein the set-top box is a HDMI 2.x capable set-top box, the device is a display device, and the cable under test is an HDMI cable, the processor further configured to:

read an Extended Display Identification Data (EDID) from the display device to determine that the display device is HDMI 2.x capable; and     when the display device is not HDMI 2.x capable, determine that a determination on the cable under test being compatible with the high speed data-transfer mode of the set-top box cannot be made.

14. The set-top box according to claim 8, wherein the authentication attempts are High-bandwidth Digital Content Protection (HDCP 2.2) authentication, the processor further configured to:

host firmware configured to execute the HDCP 2.2 authentication with the device.

15. A non-transitory computer readable medium having instructions operable to cause one or more processors to perform operations comprising:

sending, from the electronic device, data to a device at a high speed data-transfer mode over a cable under test, the electronic device and the device configured to support the high speed data-transfer mode;

determining, on the electronic device, a number of authentication attempts by the device over the cable under test; and     determining, by the electronic device, that when the number of authentication attempts by the device over the cable under test is less than a predetermined number that the cable under test is compatible with the high speed data-transfer mode of the electronic device and the device.

16. The non-transitory computer readable medium according to claim 15, wherein when the number of attempts to authenticate the device is equal to or greater than the predetermined number, further comprising:

sending, from the electronic device, data to the device at a low speed data-transfer mode; and     determining, on the electronic device, that when the authentication with the device over the cable under test has been established that the cable under test is not compatible with the high speed data-transfer mode of the electronic device.

17. The non-transitory computer readable medium according to claim 15, further comprising:

reading, by the electronic device, an Extended Display Identification Data (EDID) from the device to determine that the device can support the high speed data-transfer mode of the electronic device.

18. The non-transitory computer readable medium according to claim 16, wherein the cable under test is a High-Definition Multimedia Interface (HDMI) cable, and wherein the high speed data-transfer mode of the electronic device is a video output resolution requiring 600 MHz TMDS bus speed or greater, and the low speed data-transfer mode of the electronic device is a video output resolution requiring 340 MHz TMDS bus speed.

19. The non-transitory computer readable medium according to claim 15, wherein the electronic device is a HDMI 2.x capable set-top box, the device is a display device, and the cable under test is an HDMI cable, further comprising:

reading, by the set-top box, an Extended Display Identification Data (EDID) from the display device to determine that the display device is HDMI 2.x capable; and     when the display device is not HDMI 2.x capable, determining that a determination on the cable under test being compatible with the high speed data-transfer mode of the electronic device cannot be made.

20. The non-transitory computer readable medium according to claim 16, wherein the authentication attempts are High-bandwidth Digital Content Protection (HDCP 2.2) authentication, further comprising:

hosting, on the electronic device, firmware configured to execute the HDCP 2.2 authentication with the device.

\* \* \* \* \*